US012580585B2

(12) United States Patent　　(10) Patent No.:　US 12,580,585 B2

Secareanu　　(45) Date of Patent: 　Mar. 17, 2026

(54) LOSSLESS BINARY DATA COMPRESSION

(71) Applicant: Radu Mircea Secareanu, Phoenix, AZ (US)

(72) Inventor: Radu Mircea Secareanu, Phoenix, AZ (US)

(73) Assignee: Radu Mircea Secareanu, Phoenix, AZ (US)

( * ) Notice: Subject to any disclaimer, the term of this patent is extended or adjusted under 35 U.S.C. 154(b) by 181 days.

(21) Appl. No.: 18/500,419

(22) Filed: Nov. 2, 2023

(65) Prior Publication Data

US 2025/0150091 A1　　May 8, 2025

(51) Int. Cl.
　*H03M 7/00*　　　(2006.01)
　*H03M 7/30*　　　(2006.01)

(52) U.S. Cl.
　CPC ....... *H03M 7/3059* (2013.01); *H03M 7/6011* (2013.01)

(58) Field of Classification Search
　CPC ... H03M 7/3059; H03M 7/6005; G06N 20/00
　USPC ..................................................... 341/50, 51
　See application file for complete search history.

(56) References Cited

U.S. PATENT DOCUMENTS

| | | | | |
|---|---|---|---|---|
| 6,166,664 | A | * | 12/2000 | Acharya ................. H03M 7/40 |
| | | | | 341/59 |
| 9,251,197 | B2 | * | 2/2016 | Raufman ............ G06F 16/2365 |
| 10,122,379 | B1 | * | 11/2018 | Ciarlini ................... H03M 7/30 |

* cited by examiner

*Primary Examiner* — Jean B Jeanglaude

(57) ABSTRACT

Lossless binary data compression of any arbitrary input file is achieved by describing the file using a finite universal set of binary constructs, creating a file content of occurring binary constructs, organizing the content in sequential groups and slices, with one slice to include several groups and one group to include several binary constructs, forming two or more data structures for each slice with each data structure having specific properties with respect to a chosen binary construct, processing the formed data structures together such that compression gain is achieved, with the process of obtaining compression gain being uniquely reversible, and with when the file compression is complete, the compressed output becomes the input file for another compression cycle, with the cycle repeating until a compression criteria is met.

15 Claims, 5 Drawing Sheets

| No | Class |
|---|---|
| 1 | 4 |
| 2 | >4 |
| 3 | 1_4 |
| 4 | 2_4 |
| 5 | 3_4 |
| 6 | 4_4 |
| 7 | 5_4 |
| 8 | 6_4 |
| 9 | 7_4 |
| 10 | 8_4 |

| No | Class |
|---|---|
| 11 | 9_4 |
| 12 | 10_4 |
| 13 | 11_4 |
| 14 | 12_4 |
| 15 | 13_4 |
| 16 | 14_4 |
| 16+k | (14+k)_4 |
| (16+m)+1 | (14+m+1)_3 |
| (16+m)+2 | (14+m+2)_2 |
| (16+m)+3 | (14+m)_3_1 |
| (16+m)+4 | (14+m+1)_2_1 |
| (16+m)+5 | (14+m+2)_1_1 |
| (16+m)+6 | (14+m)_3_2 |
| (16+m)+7 | (14+m+1)_2_2 |
| (16+m)+8 | (14+m+2)_1_2 |
| (16+m)+9 | (14+m)_3_3 |
| (16+m)+10 | (14+m+1)_2_3 |
| (16+m)+11 | (14+m+2)_1_3 |
| (16+m)+12 | (14+m+3)_4 |

| RI type | 4 | 5 | 6 | 7 | 8 | 9 | 10 | 11 | 12 | 13 |
|---|---|---|---|---|---|---|---|---|---|---|
| NO 1 | 4 | 9 | 11 | 12 | 11 | 9 | 9 | 11 | 7 | 7 |
| NO 2 | 5 | 10 | 12 | 13 | 12 | 10 | 10 | 12 | 8 | 8 |

| 14 | 15 | 16 | 17 | 18 | 19 | 20 | 21 | >22 |
|---|---|---|---|---|---|---|---|---|
| 7 | 8 | 8 | 5 | 4 | 2 | 3 | 2 | 0 |
| 8 | 9 | 9 | 6 | 5 | 3 | 4 | 3 | 1 |

| No | Class |
|----|-------|
| 1 | 4 |
| 2 | >4 |
| 3 | 1_4 |
| 4 | 2_4 |
| 5 | 3_4 |
| 6 | 4_4 |
| 7 | 5_4 |
| 8 | 6_4 |
| 9 | 7_4 |
| 10 | 8_4 |

| No | Class |
|---|---|
| 11 | 9_4 |
| 12 | 10_4 |
| 13 | 11_4 |
| 14 | 12_4 |
| 15 | 13_4 |
| 16 | 14_4 |
| 16+k | (14+k)_4 |
| (16+m)+1 | (14+m+1)_3 |
| (16+m)+2 | (14+m+2)_2 |
| (16+m)+3 | (14+m)_3_1 |
| (16+m)+4 | (14+m+1)_2_1 |
| (16+m)+5 | (14+m+2)_1_1 |
| (16+m)+6 | (14+m)_3_2 |
| (16+m)+7 | (14+m+1)_2_2 |
| (16+m)+8 | (14+m+2)_1_2 |
| (16+m)+9 | (14+m)_3_3 |
| (16+m)+10 | (14+m+1)_2_3 |
| (16+m)+11 | (14+m+2)_1_3 |
| (16+m)+12 | (14+m+3)_4 |

LOSSLESS BINARY DATA COMPRESSION

FIELD

The present disclosure relates to binary data compression/ decompression, and in particular to binary data compression/decompression that are suitable to be implemented in silicon, as a circuit, in addition (or not only) to be implementable in software.

BACKGROUND

Certain aspects disclosed in the issued patents or utility patent applications (PUPA) mentioned below are being used in the present disclosure. These PUPA are filed by the same unique inventor as the present disclosure. These PUPA are mentioned here as background for this disclosure. The present disclosure represents new matter. These background PUPA are:

U.S. Pat. No. 11,677,416 (application Ser. No. 17/398, 728)
Applicant Name: Radu Mircea Secareanu
Issue date: 13 Jun. 2023
application Ser. No. 17/667,650
Applicant Name: Radu Mircea Secareanu
Filing date: 9 Feb. 2022
application Ser. No. 17/974,057
Applicant Name: Radu Mircea Secareanu
Filing date: 26 Oct. 2022

SUMMARY

At the onset, a note regarding the structure of this disclosure is required, note that will enable better understanding of the flow of the disclosure. Key concepts are defined, detailed, and exemplified, concepts that the disclosed embodiments from the present disclosure are based on. The binary data compression/decompression, or BINCOD, is progressively introduced during this process.

Several concepts and approaches for data compression/ decompression have been introduced in the above specified PUPA. The basic concepts relevant for the present disclosure are summarized as follows:

a. Any arbitrary binary input data string is represented by a corresponding combination of a well defined set of binary constructs, also called root identifiers, where this set of root identifiers consist of a well defined number of subsets of root identifiers where each of said subsets consist of a well defined number of root identifiers that have the same number of bits and where the root identifiers in each of said subset has a different number of bits.

b. Combinations of root identifiers, such as pairs of root identifiers, can be created, resulting in well defined groupings of such combinations where each grouping has a well defined number of members with each member having the same number of bits.

c. Compression is achieved by identifying a specific root identifier or combination of root identifiers having specific well defined properties, where said specific root identifier or said combination belongs to a specific subset or grouping therefore the said specific root identifier or combination has a well defined number of bits, and where this specific root identifier or combination is replacing another root identifier or combination with occurrences within said arbitrary input string, where this another root identifier or combination has a larger number of bits than said specific root identifier or combination, therefore this another root identifier or combination belongs to a different subset or grouping, and where the raw compression amount is equal to the difference between the number of bits of said another root identifier or combination and said specific root identifier or combination and depends on the number of occurrences of said another root identifier or combination.

In the present disclosure, means that create data structures are disclosed, wherein the said data structures are created to force the said root identifier or combination and said another root identifier or combination to have such properties that lead to the optimization and maximization of the compression gain. Said properties include number of bits and occurrences for said root identifier or combination and said another root identifier or combination, as well as possibly for other identifiers or combinations. Said means, for the rest of the disclosure, are exemplified using a combination of two root identifiers, therefore a pair. Any higher order combination, such as triplets, as well as a single root identifier, can be used by a person skilled in the art, and choosing such exemplification of a pair, is not limiting the present disclosure in any way, such exemplification being chosen simply for better understanding of the object of the present disclosure.

Concerning the hardware implementation aspects, as will be apparent from the details presented in this disclosure to a person familiar with digital design, the preferred hardware implementation is, due to the serial nature of BINCOD, a fully-pipelined based architecture. Such an architecture will provide the highest performance levels. Details concerning suggesting hardware implementations, and the software equivalency implementation, have been largely disclosed in PUPA, and the means disclosed here do not substantially alter the implementation aspects disclosed in PUPA on this matter, therefore these aspects will not be the main focus of the present disclosure.

BRIEF DESCRIPTION OF DRAWINGS

Embodiments will be described, by way of example, with reference to the drawings, in which FIG. 1 is used to summarise the set of Root Identifiers (RI), set that is used to describe any arbitrary binary input string, set that is used in one or more of the embodiments.

FIG. 2 and FIG. 3 are used to summarise the binary constructs, called Process Strings (PS) in which any arbitrary binary input string (IFDS) is partitioned, binary constructs that are represented by said set of RI, binary constructs that are used in one or more of the embodiments.

DETAILED DESCRIPTION OF THE INVENTION

Figure 4:
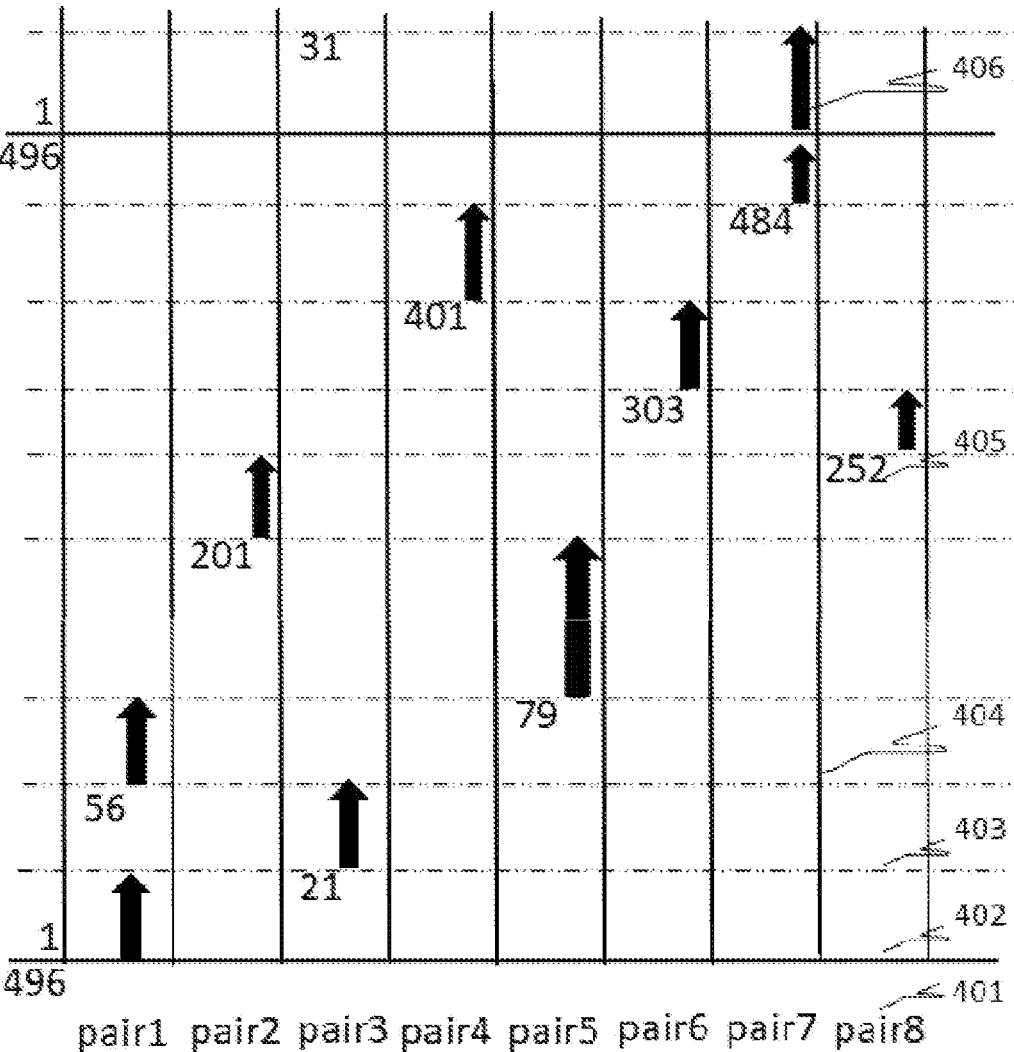
FIG. 4 is used to summarise the procedure to create a first data structure, as used in one or more of the embodiments.

At the outset it should be noted that the examples presented in the disclosure are in no way limiting, and the skilled person will appreciate that the disclosure is equally applicable to multiple variations and alternatives, and multiple optimizations are possible to increase the performance, such as the compression efficiency and speed. These variations, alternatives, optimizations are not described in this disclosure, and this does not represent any alteration to the merits of the disclosure since such variations, alternatives, optimizations are readily apparent to a person skilled in the art, and do not change the objective of the disclosure. Further, the disclosure is provided by using multiple examples, such that to facilitate straightforward understanding, at the same time in a compact, space-wise format. These examples do not limit in any way the general coverage applicable to the object of the disclosure.

The specific numbers used in these examples are for illustration purpose only, and the practical values may be chosen for different objective or subjective reasons, without affecting what is disclosed here. And finally, multiple concepts, disclosed in PUPA, are only mentioned or implied in this disclosure, some concepts that may have notable implications in broadening the coverage, applicability, and performances resulting from this disclosure such as compression efficiency and speed.

As disclosed in the above mentioned PUPA, any arbitrary IFDS can be described using a well defined set of PS, respectively a well defined set of RI. RI stands for Root Identifiers, as defined in PUPA. The set of RI considered in this disclosure is summarised in FIG. 1, where:

Rows 101 and 104 detail existing RI classes. The RI classes are greater than 3, where the number represents the number of bits in the RI.

Rows 102 and 105 detail the number of distinct RI in each class, called RI class members, excluding RI corresponding to PS of same type bits.

Rows 103 and 106 detail the number of distinct RI in each class, called RI class members, including RI corresponding to PS of same type bits.

Column 107, labelled ">22" (greater than 22), is placed in FIG. 1 for convenience, detailing in reality all PS of same type bits greater than 22. In reality, there is one entry/column for every PS of same type bits such as 22, 23, 24 . . . , theoretically to infinity, where each entry has one member. There are no RI greater than 22 other than RI describing same type bits PS.

The set of RI described in FIG. 1 corresponds to the PS classes shown in FIG. 2 and FIG. 3, where this is an example of a minimum set of classes necessary to describe any arbitrary IFDS. The set of RI described in FIG. 1 corresponds to m=k=1, where m and k are the variables that show up in FIG. 2 and FIG. 3, with their meaning described in PUPA and summarized below.

As mentioned, any arbitrary IFDS according to this disclosure can be fully described using a set of limited number of PS types, or classes. The PS classes, and their derivation, have been disclosed in PUPA. A derivation of the PS classes lead to the classes shown in FIG. 2 and FIG. 3, where FIG. 3 is a continuation of FIG. 2. In these two figures:

201 column is an index, or a counter, showing how many PS classes 202 column is showing the corresponding PS class, for every index The 203 row in FIG. 2 relates to exception PS (per the exception PS definition). In reality, there is a class for exception PS of class 5, one for class 6, and so on. Row 203 condenses all these classes into one entry.

Classes 1_4 to 14_4 do not require any further comments. These are full PS classes.

At row 204 in FIG. 3, variable k is introduced.

This k variable has a range from 1 to m, with m being the maximum value. Variable m can be minimum 1, case in which the range for k is 1 to 1, i.e. 1.

All classes (14+k)_4 are regular, full PS classes. Note that position 204 represents multiple entries. For example, if m=10, position 204 represents ten entries, i.e. ten classes, from 15_4 to 24_4. If m=1, position 204 represents one entry, i.e. class 15_4.

The value for m is chosen for various objectives, as described in PUPA. In this disclosure, a value of 1 for m is considered. Other values do not impact the substance of this disclosure.

Starting with 205, the maximum value of k, which is m, is relevant. To focus the discussion, m=1 (k=1) will be considered.

204, position 17, is class 15_4.

205 and 206 are classes 16_3 and 17_2.

Regular full PS classes, of format such as 15_4 (generally x_4) mean that in the 15 bits preceding the 4 same type bit termination, any combination of same type bit groups of 1, 2, and 3 bits can occur. Classes 16_3 and 17_2 have the same meaning, but the termination is 3, respectively 2 same type bits. Both classes 16_3 and 17_2 use a link bit just like a regular full PS, so, after the 3, respectively 2 termination, any number of bits of same type or opposite type as the termination can occur.

Positions 207 to 215 consist of three groups of classes: the 15_3 group, the 16_2 group, and the 17_1 group.

Each group consists of three classes: 15_3_1, 15_3_2, and 15_3_3, then 16_2_1, 16_2_2, and 16_2_3, respectively 17_1_1, 17_1_2, and 17_1_3.

The meaning of the three numbers is as discussed above. For example 15_3_1: 15 supports any combination of 1, 2, and 3 same type bits, and 3 and 1 are terminations of 3 respectively 1 same type bit groups. The last bit in the 15 always changes value with the group of 3, which always changes value with the group of 1.

The first two numbers always make 18 when summed (15+3, 16+2, and 17+1).

15_3, 16_2 and 17_1 are the only possible combinations in an 18 bit in the defined conditions disclosed here.

The third bit is always 1, 2, and 3 for all three 15_3, 16_2, and 17_1 groups.

None of the nine classes require a link bit (LB). This is key, because it allows to "pack" double the amount of output combinations in the same number of bits. This also means that the bit coming after the 1, 2, respectively 3 same type bit termination, always changes value.

Note that all three groups generate 18_1, 18_2, and 18_3, in different configurations (as 15_3, 16_2, or 17_1). So, in order to close and have any combination possible, regular 18_4 full PS class (with LB) is needed to be added—and that is done on position 216 (position 29 for m=1).

Accordingly, the above collection of classes, as presented and discussed with regard to FIG. 2 and FIG. 3, permit the description of any IFDS, using a predefined maximum number of bits.

In the case of m=1, this predefined maximum number of bits is 22 (18+4 from class 18_4).

In the case of m=13, this predefined number of bits is 34 (30+4 from class 30_4).

For any m, classes at positions 207 to 215 offer the needed open string. Classes at 207 to 215 are open string PS classes. These classes clearly have their own RI.

The number of required classes to cover any IFDS depends on the variable m value. For example, for m=1, 29 classes are needed. For m=13, 41 classes are needed. In other words, the number of classes required to cover any IFDS is 28+m.

The set of RI described in FIG. 1 corresponds to m=1, and this particular case will be primarily discussed to exemplify certain key aspects in this disclosure.

As mentioned, any PS has a well-defined number of bits, with this number of bits being between a well defined minimum and maximum as a function of PS, where any PS comprising a well defined identifier and a remain part.

a. Given FIG. 1, FIG. 2, and FIG. 3, it is apparent that for m=1, the said well defined number of bits is in-between 4 (for PS class 0_4) and 22 (for PS class 18_4).

b. As disclosed in PUPA, every PS class is described by one or more RI. To exemplify here for the convenience of the reader, class 4_4 is described by three RI, one of five bits (class 5 RI), one of six (class 6 RI) and one of seven (class 7 RI) bits. The said "well defined identifiers" refer to these RI.

c. The said "remain part" is represented by the number of bits of the considered PS class minus the number of bits for the applicable RI. For example, for class 4_4, the class has 8 bits total. If the five bit RI is applicable for a PS of class 4_4, then the remain part will have 8 minus 5 bits, equal three bits. As disclosed in PUPA, the remain part includes the link bit (if the class require one, such as class 4_4), or not (if the class does not require one, such as class 15_3_1). Note that the number of bits in the remain part is, for m=1, between 0 and 18.

As mentioned above, compression is exemplified in this disclosure on a pair of two RIs. As described in PUPA, the concept of pairing range refers to a set of consecutive PS in the IFDS where a pair of RI can be created between any two PS in that set of consecutive PS. For example, if the pairing range is 32 consecutive PS, 496 distinctive pairs (C32_2, or combinations of 32 taken 2) can be created. Also as described in PUPA, in a pairing range of 32, 16 pairs can be chosen in the compression process as functional pairs, where the 16 pairs are any of the 496 possible pairs, with the restriction that any one PS cannot be part of any two pairs. The optimal pairing range is shown in PUPA to correlate with the number of bits in the target RI pair, where the number of bits defines the target RI pair class. For example, a class 9 RI pair has the two RI of nine bits total, such as one RI of four bits and one RI of five bits. As shown in PUPA, the optimal pairing range for a class 9 RI pair is 32. For a class 8 RI pair, the optimal pairing range is 16, for a class 10 RI pair is 64, and so on. Different members in a class may have different optimal pairing ranges.

As a core example of this disclosure, consider the class 9 RI pair, therefore with a 32 pairing range, 496 distinctive pairs, and 16 functional pairs. Class 9 RI pair has 100 distinctive members, as shown in PUPA. For a nominal distribution, it takes 496 (considered for simplicity of this discussion as 500) groups of 32 PS (RI) so that every of the 500 pairs will have an occurrence of a specific class 9 member. In order for a specific pair of the 500 pairs to have for example three occurrences of a specific member, it takes 1500 groups of 32, or about 50,000 PS. Again, for a nominal distribution, within the occurrences of one specific pair of the 500 pairs, a specific class 9 member occurs once every 500 groups of 32, where the other 499 groups of 32 for that pair have occurrences of a different member of class 9 or of different classes. Simplified, in this disclosure will be referred to that a specific pair has 500 occurrences, one for each of the 500 groups of 32, and one such occurrence is of a specific target member of class 9, while the other 499 occurrences are either of a different member of class 9 or of a member of other classes.

Two key embodiments of this disclosure is the creation of two data structures, the first and the second data structure.

According to the first key embodiment of this disclosure, exemplified next, eight out of the 16 functional pairs in the 32 pairing range create the first said data structure.

a. The fundamental consideration of this embodiment is that while for all eight considered functional pairs, a specific class 9 member occurs once every 500 occurrences per pair, the relative position in the 500 chain is not the same in all eight functional pairs. For example, consider the class 9 member of format 4_5, where 4 stands for a four bit RI, specifically 0001, and 5 stands for a five bit RI, specifically 01000. In this considered example, this class 9 member occurs in functional pair 1 on position 56 (in short 1-56), in functional pair 2 occurs on position 201 (2-201), then 3-21, 4-401, 5-79, 6-303, 7-484, 8-252, following in the next 500 chain at 3-31.

b. The said first data structure that is created is introduced by referring to FIG. 4. In FIG. 4:

i. 401 points to the row naming the eight pairs that are considered in building the first data structure.

ii. 402 points to the solid horizontal lines delimiting two consecutive 500 chains where on the lower side of the horizontal line are the last locations in the previous chain, i.e. 496, and on the upper side of the horizontal line are the first locations in the current chain, i.e. 1.

iii. 403 points to the dotted horizontal lines where the number on the lower side of the dotted line shows the location of the occurrence of the member of interest for which the first data structure is built.

iv. 404 points to the solid vertical line delimiting the pairs.

v. 405 points to the numbers meaning the location of the occurrence of the member of interest for which the first data structure is built.

vi. 406 points to the arrows which depict the path of the first data structure. All these are better understood with the explanations provided below:

c. If the chain of 500 described above is the first in the IFDS, then the data structure starts from pair 1, and this is depicted in FIG. 4.

i. Occurrences in pair 1 are taken until the first occurrence of the specific class 9 member in any of the eight considered functional pairs. In the above example, that will be pair 3, position 21. Therefore, the first 21 occurrences are taken from pair 1, or, in short, the data stricture is 1_(1-21). Note that the location 21 is included in pair 1, not in the pair where the occurrence exists, i.e. in pair 3. In other words, the first data structure "hops" in the pair where the occurrence happened, which is pair 3 in this case, immediately after the occurrence happened in that pair, i.e. starting with location 22 the first data structure hops in pair 3.

ii. The occurrences that are taken in the said first data structure continue with the pair where the member occurrence was noted, specifically pair 3, from position 22 to position 56, since in pair 1 the next member occurrence is noted on position 56. Therefore the data structure continues with 3_(22-56)

iii. The said first data structure continues similarly as described above, with the occurrences in pair 1, from position 57 to position 79, since in pair 5 the next member occurrence is on position 79. Therefore, the data structure continues with 1_(57-79).

iv. And so on, the occurrences that are taken in the said first data structure continue with pair 5, from position 80 to position 201 (pair 2). Therefore, 5_(80-201)

v. The occurrences that are taken in the said first data structure continue with pair 2, from position 202 to position 252 (pair 8). Therefore, 2_(202-252).

vi. The occurrences that are taken in the said first data structure continue with pair 8, from position 253 to position 303 (pair 6). Therefore, 8_(253-303)

vii. The occurrences that are taken in the said first data structure continue with pair 6, from position 304 to position 409 (pair 4). Therefore, 6_(304-409).

viii. The occurrences that are taken in the said first data structure continue with pair 4, from position 410 to position 484 (pair 7). Therefore, 4_(410-484)

ix. The occurrences that are taken in the said first data structure continue with pair 7, from position 485 to position 31 (pair 3 of the next 500 chain of occurrences). Therefore, 7_(485-496) plus 7_(1-31).

x. Note how the said first data structure makes the transition between consecutive chains of 500 occurrences, as shown at (ix.) above.

xi. In short, the said first data structure is: 1_(1-21), 3_(22-56), 1_(57-79), 5_(80-201), 2_(202-252), 8_(253-303), 6_(304-409), 4_(410-484), 7_(485_496) plus 7_(1_31).

d. If the chain of 500 occurrences is not the first in the IFDS, then the said first data structure differs from the fact that the data structure does not start with pair 1, but continues with the last pair with member occurrence from the previous chain, as shown at (ix.) above. For example, if in the previous 500 chain the last pair with occurrence was pair 6, then the data structure will be:

i. 6_(1-21), 3_(22-56), 1_(57-79), 5_(80-201). 2_(202-252), 8_(253-303), 6_(304-409), 4_(410-484), 7_(485_496) plus 7_(1_31).

Note that the said first data structure that is formed has zero occurrences of subject member 0001_01000. A member of a class with zero occurrences is exactly one means to create compression according to several embodiments disclosed in PUPA, specifically by using this member to replace a member (members) of a class (classes) with a larger number of bits.

Figure 5:
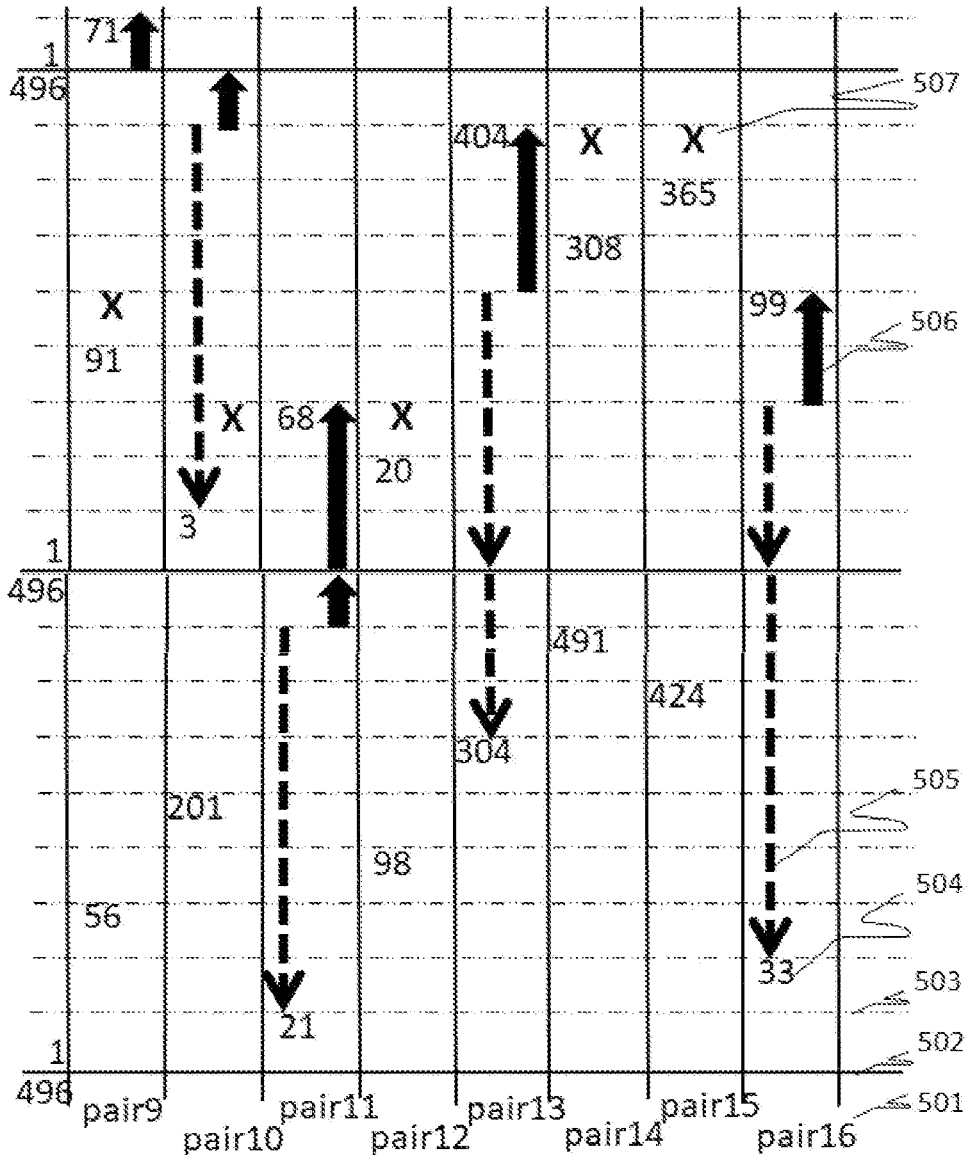
FIG. 5 is used to summarise the procedure to create a second data structure, as used in one or more of the embodiments.

In a second key embodiment of this disclosure, the other eight out of the 16 functional pairs in the 32 pairing range are taken, and a second data structure is formed, as follows. These other eight pairs are named, to eliminate any confusion with the first data structure, as pairs 9, 10, 11, 12, 13, 14, 15, and 16. For clarity of this discussion, the same member is tracked in two consecutive 500 chains (plus the first member occurrence in the third chain), with the following occurrences of the member: 9-56, 10-201, 11-21, 12-98, 13-304, 14-491, 15-424, 16-33, 9-91, 10-3, 11-68, 12-20, 13-404, 14-308, 15-365, 16-99, 9-71.

a. This said second data structure is formed as follows:

a. Similarly to the first data structure, if the 500 chain is the first in the IFDS, the said second data structure starts also with the first pair, which is pair 9 now. Therefore, i. This said second data structure starts with pair 9, and continues until the first occurrence of the subject member in pair 9, respectively 9_(1-56).

ii. Then, the general rule is that it looks in the previous 500 chain and finds the pair that will have a subject member occurrence in the current 500 chain with the highest probability. That is, since the probability of a class 9 member occurrence is one every 500, that it finds the pair that has the largest number of non-member occurrences to the current location, or in other words it searches for the member occurrence, in any of the eight pairs, that is the farthest from the current location. That will be the pair with the highest probability to have another member occurrence. For the case of the 500 chain being the first in the IFDS, the data structure simply moves to the pair that did not have in the positions up to the current position a member occurrence. For example, the current position now is position 56. Pair 11 with position 21, and pair 16 with position 33 are eliminated, because the probability of having another occurrence at position 56 for those pairs is lowest. Pairs 10, 12, 13, 14, and 15 are equal in this case, therefore pair 10 is taken since it is the first in the numerical order among the equals in probability.

iii. The said second data structure therefore continues in pair 10, until the member occurrence, therefore 10_(57-201).

iv. Since the current position is 201, pairs 9, 10, 11, 12, 16 are eliminated for the reasoning explained above, and pairs 13, 14, 15 are equal. The data structure continues on pair 13 (the first of the equals), therefore 13_(202-304).

v. Since the current position is 304, pairs 9, 10, 11, 12, 13, 16 are eliminated, and pairs 14, 15 are equal. The said second data structure continues on pair 14 (the first of the equals), therefore 14_(305-491).

vi. For the last leg of the said second data structure, it looks in the second 500 chain at the general rule mentioned at (ii.) above, and it finds that for the current position 491, pair 11 meets the rule condition the best. Therefore, the last leg is 11_(492-496) plus 11_(1-68).

vii. Therefore, this second data structure for the first 500 chain is 9_(1-56), 10_(57-201), 13_(202-304), 14_(305-491), 11_(492-496) plus 11_(1-68) in the second 500 chain, b. For the second 500 chain, the second data structure continues based on the general rule described above. The second data structure is exemplified next, with reference to FIG. 5. For clarity, the meaning of the notations in FIG. 5 is:

i. 501 is pointing to the row describing the names of the eight pairs: pair 9, pair 10, pair 11, pair 12, pair 13, pair 14, pair 15, pair 16.

ii. 502 is pointing to the solid horizontal lines with the meaning that this line is describing the border between consecutive 500 chains. This line has on the lower side location 496 as the last location of the previous 500 chain, and on the upper side location 1 as the first location in the current 500 chain.

iii. 503 is pointing to the horizontal dotted lines where the number on the lower side of the dotted line shows the location of the occurrence of the member of interest for which the second data structure is built.

iv. 504 points to the numbers meaning the location of the occurrence of the member of interest for which the second data structure is built.

v. 505 points to the dotted arrows showing that at that point and with respect to the location from where the arrow starts, a decision is taken in which pair and with respect to which member (indicated by where the arrow ends), the second data structure continues, all based on the general rule introduced above.

vi. 506 points to the solid arrows which depict the path of the second data structure.

vii. 507 points to the "x" sign, symbolizing that those pairs are eliminated from continuing the second data structure because they have the lowest probability of occurrence of the member of interest, among the other pairs.

c. All these are better understood with the explanations provided below in deriving the second data structure. Therefore, the second data structure continues as follows:

i. As shown above, the last leg of the second data structure through the previous 500 chain is through pair 11, and therefore continues into the current 500 chain into pair 11. Therefore, the second data structure continues into the current 500 chain with 11_(1-68), as shown above.

ii. Then, for the current position 68, pairs 10 and 12 are eliminated because these pairs just had a member occurrence, therefore the probability of having another member in the same pair is the lowest. Pair 11 is also eliminated for the same reasoning (location 68 is in pair 11, therefore having another occurrence in pair 11 has the lowest probability). For the remaining pairs, respective pair 9, 13, 14, 15, and 16, applying the general rule mentioned above, pair 16 is optimal because the last occurrence of the member is the farthest from current location 68. Therefore, the data structure continues with 16_(69-99).

iii. Same reasoning as detailed above for the derivations at location 68 apply. Therefore, for the current position 99, pairs 9, 10, 11, 12, and 16 are eliminated. From the remaining pairs, 13, 14, and 15, applying the general rule, pair 13 is optimal. Therefore, the said second data structure continues as 13_(100-404).

iv. At location 404, all the pairs are locked, i.e. they had an occurrence in the current 500 chain, therefore the second data structure continues into the pair that had the farthest occurrence from location 404, because that pair has the highest probability of having another member occurrence. In this case, that pair is pair 10. Therefore, the second data structure continues with 10_(405-496).

v. Since in the third 500 chain, the only member occurrence is 9-71, the second data structure continues with 9_(1_71). This situation is an exception, and it applies only when in the last 500 chain there is only one occurrence for the member of interest. If in the third chain there was no member occurrence, then the said second data structure would have continued with pair 10 until the last existing position in the third chain. Say this position (of non-member occurrence was also 71, then the said second data structure would be 10_(405-496) plus 10_(1-71).

vi. Therefore, the said second data structure, for the above given input data, is 11_(1-68), 16_(69-99), 13_(100-404), 10_(405-496) plus 9_(1-71).

d. The full second data structure over all three 500 chains is being derived as 9_(1-56), 10_(57-201), 13_(202-304), 14_(305-491), 11_(492-496), 11_(1-68), 16_(69-99), 13_(100-404), 10_(405-496) plus 9_(1-71).

It is apparent at this time that while the said first data structure is created to generate a data string across the entire input data that will have zero occurrences of a specific member of a target class, the said second data structure is created to generate a data string across the entire input data that will have a larger than the nominal number of occurrences of a specific member of a target class. For both data structures, this is achieved by "hopping" in-between a preselected number of RI pairs according to well-defined specific rules.

Focusing on said second data structure for the example discussed above, the said nominal number of occurrences of a specific member of class 9 is one every 500 occurrences. Applying the rules discussed above in creating the said second data structure, the number of the specific member of class 9 increases to four for the first 500 chain and three for the second 500 chain, with the maximum, according to a nominal distribution, being eight (i.e. the number of pairs chosen to hop in-between).

According to several embodiments disclosed in PUPA, a first data structure with a class member that has zero occurrences and a second data structure with a class member that has a larger number of occurrences enables compression. In this disclosure, different means to create the first and the second data structure are disclosed than those disclosed in PUPA.

A person skilled in the art can develop other rules in developing a first data structure and a second data structure with the objective to create compression. Covering the tremendous amount of possibilities in developing such rules is not the objective of the present disclosure because creating such rules is obvious for a person skilled in the art, and the outcome is the same-two data structures, the first and the second, which, when used together, create compression. In other words, the rules presented above in creating the first data structure and the second data structure exemplify the essence and object of the disclosure, which is the use of well defined rules in order to create two data structures by using the data available in multiple well defined singles, pairs, triplets, or any other higher level combination, where the said two data structures are used together in order to create data compression.

Also, there is a tremendous amount of variations and optimizations in creating the said first and said second data structures starting from the principles disclosed above, besides developing other rules or based on the rules presented above. Some of these variations and optimizations are described below with the title of examples. A person skilled in the art will be able to immediately generate other variations and optimizations, since these will be obvious to such person skilled in the art, therefore it is not the goal of this disclosure to exhaustively cover all such variations and optimizations—this would be practically impossible due to their extent.

Among these variations and optimizations, the following that are considered representative are discussed next.

1. Note that in the said first data structure, eight pairs have been chosen to hop in-between in the above example. A different number of pairs can be chosen, and the choice of the number of pairs has the following significance. An example is considered in order to make the exposition below clearer.

a. Consider the following member occurrence sequence: 1-56, 2-201, 3-21, 4-401, 5-79, 5-123, 6-303, 7-484, 8-252.

b. The first data structure (considering this is the first 500 chain in the IFDS), is 1_(1-21), 3_(22_56), 1_(57-79), 5_(80-123), 5_(124-201), 2_(202-252), 8_(253-303), 6_(304-401), 4_(402-484), 8_(485-496).

c. Note that the member occurrence 5-123 is captured in the first data structure, therefore this first data structure does not have zero occurrences for the target member—it has one occurrence. That is not desirable.

d. One way to prevent this undesired event from happening (i.e. to capture one or more member occurrences in the first data structure) is to increase the number of pairs in-between which the first data structure can hop. For example, 16 pairs can be used instead of 8. With more pairs, a better distribution of member occurrences among the considered pairs is made, with smaller intervals. For example, the theoretical interval, for ideal nominal distribution, when four pairs is considered is 500 over 4, or 125. For 8 pairs this interval drops to 62. For 16 pairs, this theoretical interval drops to 31. And so on.

e. Coming back to the example discussed above, the eight extra pairs (from 8 to 16) will theoretically introduce another member occurrence in-between position 80 and position 123, therefore the member occurrence at position 123 is not going to be captured in the first data structure.

f. The disadvantage of considering more pairs to overcome the above described undesired situation is that more data is required in order to produce the same compression. This means that a larger file floor size will be in place (as disclosed also in PUPA, the compression works until the file floor size is reached). For example, if four pairs are considered for the first data structure and four pairs are considered for the second data structure, with a target member of class 9, then the file floor size is 500*8=4000 pairs, or 8000 PS, or about 120,000 bits. This file floor size doubles if the number of pairs is doubled for both data structures. If the number of pairs is 512 for both data structures (an extreme, but theoretical case, where the hoping granularity is one), then the file floor size is about 8 million bits. The file floor size is important because it may limit for what type of applications the compression can be applied for. For example, an 8 million bits file floor size when a high definition movie is compressed is no issue, but it may be an issue when the target application will compress live streaming hi-fi audio, when even the 120,000 bit file floor size may produce a disturbing latency. For such applications, having a small file floor size is key, and this file floor size can be reduced further by considering a class 8 target member, or used single RI based members instead of RI pair based members.

g. For example, for a class 8 member, the nominal granularity interval between member occurrences is 120 (instead of 500). Therefore, for four pairs in each of the two data structures, the file floor size becomes about 1,000 pairs, or 2000 PS, or about 30,000 bits.

h. The file floor size can be reduced further, to accommodate specific applications. For example, both data structures can use the same four pairs. The restriction is that if for example the first data structure uses unrestricted the full four pairs, the second data structures cannot use the legs that the first data structure used. For example, if the first data structured used the leg 1_(1-56), the second data structure cannot use any of the RI pairs that have been used in this leg by the first data structure. By using the same number of pairs by both data structures, the file floor size becomes about 500 pairs, or 1000 PS or about 15,000 bits. Yet further means to reduce the file floor size further are possible before using a different environment such as the environment based on single RIs instead of pairs.

i. An example of using an environment based on single RIs instead of pairs is provided also below to exemplify the further reduction of the file floor size using this technique as well.

2. The significance of the chosen number of pairs for the second data structure is different than for the first data structure. For the second data structure, the theoretical number of member occurrences captured in the data structure is equal to the number of pairs. Practically, the larger the number of pairs, the larger the number of member occurrences captured in the second data structure, and therefore the more efficient the compression. The number of pairs in the first data structure is not correlated to the number of pairs in the second data structure—for each data structure, these are chosen for completely different reasons.

3. The compression scheme presented in this disclosure, using the two data structures, has a cost, where the components of this cost can vary greatly. Some examples are given next.

a. As mentioned, in a pairing range of 32, there are about 500 possible pair types. Out of these 500 pair types, 16 are chosen as functional pairs. The default is when the 16 pairs are chosen in-between consecutive RI, i.e. 1 with 2, 3 with 4, and so on, 31 with 32. If a different set of pairs is used, then such set of pairs must be specified, and specifying such set represents a cost. In PUPA, one or more embodiments were disclosed where a specific pair which by natural distribution had a specific quality, was specified in clear. For example, for a pairing range of 32 (specific to a class 9 RI pair), nine bits were used to specify such pair. While for this disclosure, specifying the pairs considered for first or second data structures can be similarly done in clear, this is not necessary because of the nature of creating the two data structures, by hopping in-between the considered pairs. Generally, considering the default set of pairs (mentioned above) is sufficient. However, if in the default set of pairs an undesired situation where a target member occurrence is captured within the first data structure, as described above, or where the number of target member occurrences captured in the second data structure is below average, the default set of RI pairs can be changed within a well defined number of choices. Such number of choices can be described for example with 7 bits (128 pair choices), and these seven bits represent a cost of the compression scheme disclosed here. The most extreme case is when all pairs are specified in clear. For example, for a class 9 RI pair, there are 496 pairs, that can be specified using 9 bits. If eight pairs are used for the first data structure and eight pairs are used for the second data structure, and the pairs in both data structures are specified in clear, the cost will be 8 times 9 plus 8 times 9, equal 144 bits.

b. Another common cost, which may be independent or not with the cost of choosing the pairs described above, is the cost of choosing a target member. For example, in a class 9 RI pair there are 100 members, in a class 8 RI pair there are 25 members, in a class 10 RI pair there are 220 members, and so on. Not necessarily, for a given choice of number of pairs and pair choices (such as class 9 RI pair with default pair choices and 8 pairs), each of the 100 members of the class will be able to create a first data structure with zero member occurrences or a second data structure with an above average number of member occurrences. But the probability that one of the 100 members will create a first data structure with zero member occurrences and same or another member of the 100 members will create a second data structure with an above average number of occurrences, increases substantially. To specify a common member that will create a first and a second data structure meeting the above will take seven bit cost (specify one of the 100 class 9 members), while to specify two members (one member to create the first data structure and a second member to create the second data structure) will require a cost of 13 bits for class 9 members.

c. An alternative to the cost at (a.) and (b.) above, applicable to the first data structure, is disclosed next. This alternative therefore refers to the cost associated to choosing the pairs and to choosing the target member in order to avoid having a first data structure that has non-zero target member occurrences. The alternative consists in adapting an embodiment disclosed in PUPA, where two target members with minimal number of occurrences were used instead of the single member with zero occurrences.

i. The condition to implement this alternative in this case is that for no member in the considered RI pair class, for the considered functional pairs, a first data structure with zero occurrences cannot be created, because otherwise the member creating a first data structure with zero occurrences will be considered. Another implementation of this condition is that two specific members only are considered (instead of all members in the class), case in which this alternative is implemented only if both members cannot create a first data structure with zero occurrences.

ii. Considering that any of the two conditions described above are met, two members that cannot create a first data structure with zero occurrences are considered, with the condition that these two members create a first data structure that has a minimal number of occurrences among all other members. In this case, the first data structure created by the first member will be called the first first data structure, and the first data structure created by the second member will be called the second first data structure. The second first data structure may use the same functional pairs as the first first data structure, or different functional pairs, as discussed above.

iii. The embodiment disclosed in PUPA will be adapted to this situation, essentially consisting in the fact that the occurrences in the first first data structure will receive a unique suffix (such as a 0 bit), while the occurrences in the second first data structure will receive another unique suffix (such as a 1 bit). The occurrences in the second first data structure will be swapped with RI pairs in the first first data structure keeping the same occurrence position in the two structures. The swapped RI pair member can be any RI pair member, in any class. The outcome is that by these unique suffix assignments and swapping operation, the second first data structure will become a zero occurrence data structure for the member that received the unique suffix, while the first first data structure will have the members that occurred in both first first and second first data structures, each with a unique differentiating suffix. The cost will be equal to the sum of non-zero target member occurrences in first first and second first data structures, respectively equal with said sum times the number of bits in said two unique suffixes (which number of bits in this example was one).

d. Yet another embodiment to reduce the cost for both data structures works as follows. For each of the sets of pairs established for first and second data structures (for example, first eight pairs for the first data structure, last eight pairs for the second data structure, in a 32 pairing range, with a class 9 target member), the pair transformation for the data string is performed, as described in PUPA. Then, for the pairs of each data structure, all 100 members are swept in a well defined order, and for each member, in that order, a data structure is created. The sweep stops at the first member that generates a data structure that meets the requirements (zero member occurrences in the data structure for the first data structure, and above average member occurrences in the data structure for the second data structure).

e, Even further, distribution particularities can be used. For example, if a class 8 member is considered, a pairing range of 16 is going to be taken. The probability of occurrence of a 4 bit RI is about 6%, as described in PUPA, meaning that in a pairing range of 16, every of the five 4 bit RI occurs once. To create a class 8 RI pair, two four bit RIs are needed. Class 8 RI pair members that consist of two different four bit RIs (there are 20 such class 8 RI members), have the probability of occurrence of about 1 every 125 occurrences within a specific pair. The other five class 8 RI pair members (where the pair is formed by two same type RIs), have theoretically a zero probability of occurrence (because nominally only one occurrence of a specific 4 bit RI member can occur in a 16 pairing range). Practically, such an RI pair (made of two same type RI) occurs function of distribution, with the probability of occurrence being smaller than the other 20 members. Therefore, these five class 8 members are best choices to track and create a first data structure using them as the target member. One of the other 20 members are best to be used for the second data structure as the target member.

4. It has been discussed above that instead of pairs, either singles, or triplets, or upper order combinations of RIs can be used to build the two data structures. The triplets and upper order combinations are on the same behaviour as the pairs case, described in detail above. The advantage of these upper order combinations is an improved distribution of members and more options in choosing members to compress. Using singles on the other hand has the advantage that the file floor size is the smallest, which is the ideal case for specific applications such as audio codec for live hi-fi communication where small files are essential for reduced latency. An example of using an environment based on singles (single RIs) is provided next. The example is basic, unoptimized in any way, and is intended only to provide the fundamentals. A parallel with the concepts introduced and exemplified in detail above for pairs is made, using similar language and explaining the parallel only where it may not be obvious to follow.

a. The target member is a class 4 RI. The probability of occurrence of a class 4 RI is about one in 16 occurrences. There are 5 class 4 RIs, therefore three bits are required to specify the target member. It is therefore considered that the cost is three bits to specify the member plus an additional three bits for the header, therefore a total cost of six bits.

b. Considering two chains of 16 (parallel to the chains of 500) and using 8 instances for each data structure (where the instances is the parallel to the 8 or 16 pairs exemplified above), and considering for the second structure an average number of occurrences of four per chain of 16, it means that two chains of 16 are necessary to obtain an average of eight bit gross compression gain.

c. Since the gross average compression gain is 8 bits and the cost is 6 bits, the net compression gain is two bits.

d. The file floor size is two chains of 16 times 8 instances per data structure times two data structures times 15 bits average per PS, equals 2*16*8*2*15, which equals to about 8000 bits. Note the very good hopping granularity, of 1:2 that is achieved, since the chain is of 16 and there are 8 instances per data structure. If this granularity is reduced, for example to 1:4, the file floor size can be reduced to half, therefore to 4000 bits.

An actual implementation example covering the creation of first and second data structures and an actual cost example, all in order to produce compression, is described next. The example is intended to clearly show how the compression works, and in no way this example should be taken as limiting the object of the disclosure since, as mentioned, a tremendous amount of variations and optimizations are possible, variations and optimizations that are obvious to a person skilled in the art.

Example Conditions

Class 9 members are considered as vehicle for compression. The pairing range is therefore 32. There are 100 class 9 members.

Default pairing is considered, at zero cost.

A number of 16 pairs are considered for the first data structure and 16 pairs for the second data structure. Since in a 32 pairing range there are 16 functional pairs, it means that 2 pairing ranges are used at once to create one set of compression data. In each of the two pairing ranges in the set, the first eight functional pairs are considered for the first data structure, and the last eight functional pairs are considered for the second data structure. Since 16 pairs are considered for each of the two data structures, the nominal probability of occurrence for a specific member is one every 32 sets of pairs, to match the 1 every 496.

In this example, it is considered that the distribution of class 9 members in the input data stream warrants that for the first data structure, member number 7 out of the 100 class 9 members creates a first data structure with zero occurrences.

As disclosed in PUPA, to create compression, a multitude of schemes can be used, including using two members of a target class, a member of a target class and a chain of members of upper classes, or a member of a target class and several members of an upper class. In this example, the scheme of using a member of a target class and several members of an upper class is exemplified. Specifically, the said member of a target class is member number 7 of class 9 RI pair, and said several members of an upper class is all members of class 19 RI pair.

A few words are necessary to explain how all members of class 19 are going to be used. Compared to a class 9 member, a class 19 member has a 1024 times lower probability of occurrence. There are 1,138 class 19 members. When 1024 members are considered in the scheme, then the probability of occurrence of any of the 1024 considered class 19 members is the same as the probability of occurrence of a specific class 9 member. As disclosed in PUPA, all considered 1024 class 19 members can be described using 18 bits (instead of 19 bits, producing therefore a gain of one per occurrence of a class 19 member) when a class 9 member with zero occurrences in a given data structure is available—that is because each of the 1024 class 19 members will have double representation-one native in 19 bits, and the other one consisting in the class 9 member followed by a 10 bit suffix. The other 124 class 19 members (1138 minus 1024) remain with the standard native representation, and their occurrences produce no gain.

In the 16 pairs considered in this example to create the second data structure, all occurrences of any class 19 member will be considered in order to create the second data structure by hopping in-between the 16 pairs, as described above. Since, as mentioned, the probability of occurrence of any of the 1024 considered class 19 members is the same as the probability of occurrence of a specific class 9 member, in the 16 pairs considered in this example to build the second data structure, the maximum nominal number of occurrences of any of the 1024 considered members in a 500 chain is 16. Considering the average number of occurrences in a second data structure as seven, two chains of 500 are needed in order to produce a gross gain larger than the cost of seven noted up to now for the first data structure. With two chains of 500 being considered, in this example, the total number of occurrences of any class 19 member belonging to the 1024 considered members is going to be 14, i.e. right on average. The gross gain that is produced therefore is 14.

This example is considered to portray the risk of considering all members of an upper class. The risk is that compared to when a specific class 9 member is considered to build the second data structure when there are 100 possibilities (one for each class 9 member), here there is only one possibility (all members of class 19 must produce an above average number of occurrences in a second data structure). The advantage is that while in the case of a specific class 9 member when the cost was seven bits (to specify one of the 100 members), here the cost is zero (since there is only one option). There is however a header cost, to differentiate and specify when the scheme considers a class 9 member, and when is considering other situation, such as members of an upper class. Such header can be a 0 bit which will mean that a class 9 member is considered, and this 0 bit is followed by seven bits to specify the considered member, or the header can be a 1 bit followed by for example two bits which will specify which upper class is used, such as from class 15 to 19. If for example these two bits will specify that class 15 is used, those two bits will be followed by other four bits to specify which section of the class 15 members is considered, since class 15 has 872 members, a class 9 member can uniquely describe 64 class 15 members which will produce a gain of one, and there are about 15 sections of 64 members to make 872, therefore four bits are necessary to specify these sections.

The total cost and net gain in this example can be derived at this time. The total cost will be seven bits to specify member 7 class 9 for the first data structure, plus three bits to specify that all members of class 19 are used for the second data structure, therefore a total cost of 10 bits. Since the gross gain is 14, as mentioned of being generated by the second data structure, the net gain will be 14 minus 10, equal 4 bits.

In order to implement the compression, member 7 must have zero occurrences in the second data structure, but it has zero occurrences in the first data structure. Any of the techniques disclosed in PUPA to transfer occurrences between two data structures can be used, but yet another techniques is disclosed here. Specifically, the occurrences of member 7 in the second data structure are transferred in the first data structure exactly on the position on which they occur in the second data structure. On the position of the transfer in the first data structure, there was a member of whatever class, which will be transferred on the same position in the second data structure. Therefore a swap will be created in between the first data structure and the second data structure, to move all member 7 class 9 members out of the second data structure into the first data structure. At restoration (decompression) there is no confusion created, because member 7 is specified in clear and it is known that the member 7 members occurring within the first data structure are swapped from the second data structure. Note also that the members swapped into the second data structure from the first data structure can be of class 19, producing extra gain, albeit the probability is small (about 14/1024 in this example).

The file floor size will be two groups of 500 where each group consists of two 32 pairing ranges, therefore 1000*32*2 PS, with each PS having an average of 15 bits, therefore a file floor size of about 1 Mbit.

The decompression will occur as described below.

The 10 bit code is read and interpreted, describing that member 7 of class 9 is used for the first data structure, and that all members of class 19 are used for the second data structure.

The focus is then moved on the pairs used for the second data structure. Since 512 members of class 19 in the second data structure are transformed in the format <member 7 class 9><9 bit suffix> while the other 512 members are using the <native representation with the last bit dropped> (resulting also in 18 bits), then there is the risk for the representation of the 512 members using the member 7 class 9 prefix to create confusion at decompression, as follows:

If the 500 chain is the first in the IFDS, the second data structure is built by taking the first pair in mathematical order among equals, as shown. The problem with that at decompression is that when the equals are identified, a member 7 occurrence may happen naturally in one of the equals before the occurrence of a class 19 member in the correct, different equal. In this case, the decompression will incorrectly take the equal with the member 7 occurrence as the decompression path. Therefore, a first restriction must be imposed in building the second data structure:

First restriction: The first 500 chain in an IFDS must not be part of a second data structure built. The second data structure built must always start with the second 500 chain. The first 500 chain must always be left as is, as a buffer.

As discussed, the rule to build the second data structure in a regular 500 chain that comes after another 500 chain is that the hopping in-between the pairs occur into the pair that has the highest probability for a target member to occur, which is the pair that had the target member occurring the most farthest from the current position, be that in the previous 500 chain. If, in the example discussed here, location 136 of pair 9 in the previous 500 chain is the farthest occurrence location for the current position in the current 500 chain which is location 94 in pair 3, then the next hopping for building the second data structure is from pair 3 to pair 9 from location 95 to location 189 where the next occurrence of a class 19 member is. Therefore, the second data structure for this segment is 9_(95-189) with the previous one being 3_(?-94). Considering that location 136 of pair 9 in the previous 500 chain has been transformed in the <member 7 class 9><9 bit suffix> format, in-between location 136 of the previous 500 chain and location 96 in the current 500 chain, a member 7 class 9 may naturally occur while in the another pair, such as pair 12 for example, another member 7 class 9 may naturally occur as well but before the naturally occurring member of pair 9. In the simplest form of implementation, the decompression will interpret the member 7 class 9 occurrence of pair 12 as the farthest transformed member and therefore the decompression path to follow, instead of ignoring the naturally occurring member 7 class 9 in pair 9 and taking the correct decompression path through member 7 class 9 occurrence at location 136 of the previous 500 chain of pair 9. There are two ways to resolve this conflict that can lead to incorrect decompression:

Alternate the 500 chains in-between active and passive. A passive 500 chain is defined as a chain that remains as is, it is not transformed in any way and is not part of the two data structures. The role of the passive 500 chain is to maintain reference for building the second data structure in particular. For example, with a buffer 500 chain, the class 19 occurrences in the buffer 500 chain remain as is, and therefore no false path can be created as described above. False path as described above can still be created within locations of the current chain, but these can happen only for the last hopping positions within the second data structure built, and can be computationally resolved, as explained next.

Resolving the false path computationally. Note that the false path exemplified above is generated when the reconstruction is done by looking top to bottom. That is the fastest, and in decompression speed is very important, however, if the decompression is restored bottom to top, no false path is possible. A bottom to top reconstruction means that at every hopping, the entire path is reconstructed starting with the first member in the data structure, in order to determine the current correct hopping member. For example, as discussed above, if the reconstruction of the second data structure is done from the first segment and member up (bottom to top), then member of location 136 of pair 9 in the previous 500 chain is determined as part of the second data structure and member of location 96 in the current 500 chain is determined as the next hopping member.

The disadvantage of the second approach is that it is computational, therefore the reconstruction, or decompression is slower than the first approach, limiting certain application where decompression speed is paramount. The disadvantage of the first approach is that it doubles the file floor size, which, for some applications, can be a show stopper or can be an important limitation. Of course, there are applications where the speed impact of the second approach is not important, and there are applications where the file floor size increase of the first approach is not important.

All reconstructed hopping locations are reversed in term of their content, i.e. from the 18 bit compressed representation as either <member 7 Class 9><9 bit suffix> format or <native representation with the last bit dropped> format back to the original corresponding <native 19 bit representation>.

Once the second data structure is reconstructed, then the reverse swapping of members is performed between the first data structure and the second data structure, respectively all the member 7 class 9 occurrences in the first data structure are moved back on the respective location in the second data structure, while the members of whatever class on that location from the second data structure are moved back in the first data structure.

Decompression and reconstruction is complete.

While a first and a second data structure has been exemplified, more than two data structures can be defined in order to achieve a target compression in optimal conditions. This aspect has been briefly addressed above with regard to the first first data structure and second first data structure discussion. Generalizing that discussion example, a first data structure can be defined in order to have a first member with a minimal number of occurrences, a second data structure can be defined to have a second member with a minimal number of occurrences, and a third data structure can be defined to have a third member with a large number of occurrences, such that the said first member and second member are subject to such operations as replace and swap in-between the first data structure and the second data structure in order to create a member with zero occurrences which will be subject to other operations such as replace and swap between the first, second, and third data structures in order to create a positive net gain consisting of a gross gain minus the cost associated to the implementation. Clearly, further generalizing this example, a person skilled in the art can create any number of such data structures that, when combined, will lead to creating optimal compression gain. Detailing and exemplifying primarily two data structures is performed in this disclosure for clear understanding of the fundaments that are involved, and do not represent any limitation of the present disclosure.

Across the disclosure, multiple discussions occurred to provide insight intu embodiments to reduce cost and reduce the floor size. On the other side of the spectrum, an embodiment is exemplified next with the goal to show the advantages of using most of the options discussed across the disclosure in one compression setup. This example shows that cost optimizations are not required as long as the application is of a certain type. Essentially, in this example, the cost is comparatively very large and the floor size is also comparatively very large, with both cost and floor size not being optimized in any way, meaning that whatever is necessary is considered. The applications accommodating such compression conditions are applications where the input file to be compressed is proportionally large. For example, the input file is a high definition movie, of a few Gb size.

Therefore:

a. The input file to be compressed has a size of a few Gb or larger.

b. The compression is implemented using three data structures, respectively a first first data structure, a second first data structure, and a second data structure.

c. For the first first and second first data structures, the target members are pairs of class 9.

d. The file is partitioned in a few slices, where each slice consists of 256 500 chains and 24 pairs per chain, therefore with eight pairs per data structure.

e. Accordingly, the floor size is 256 500 chains times 24 pairs per chain, equals $256 \times 500 \times 24 \times 2 \times 15$ bits, equals about 100 million bits.

f. In addition, in order to insure a conservatively safe decompression, the 256 500 chains are alternated between active and passive, therefore there will be 512 500 chains in total, therefore the file floor size is 200 million bits.

g. For the first first data structure, one member, called member 1, of the 100 class 9 members is specified in clear, therefore a seven bit cost, where member 1 has the minimum number of occurrences that are captured within this first first data structure. To find the optimal configuration of this first first data structure, eight pairs out of the 512 possible pairs into the 32 search range are specified in clear, for a cost of 8 pairs times 9 bits, equals 72 bits. Therefore the cost for the first first data structure is 79 bits.

h. Exactly the same configuration and cost is noted for the second first data structure. In the second first data structure, another member is chosen, called member 2.

i. In both first first and second first data structures, the member and the pairs are chosen using the maximum possible options with the goal to find the optimal configuration such that the two data structures have the minimum number of target members captured within the respective data structure. A pessimistic number of target members captured are considered for this example to be 128 for each of the two data structures. In other words, in each of the two data structures, every other 500 chain captures a target member. Given the wide range of choices in term of choosing member and pairs, this is a pessimistic scenario. The member/pairs choice is done for each data structure based on a computational, optimization procedure.

j. Once member 1 and member 2 and the pairs are chosen for the two data structures, the definition of the first first and first second data structures is complete. Member 2 is swapped on locations into the first first data structure, where whatever was on those locations is swapped into the second first data structure. Once in the first first data structure, member 2 is altered to be distinguished from naturally occurring member 2 in the first first data structure. Using the altered member 1 in the first first data structure, naturally occurring member 2 remain at a nine bit representation, while the altered member 1 and member 2 have a ten bit representation each. The ten bit representations of member 1 and member 2 represent a cost of one bit per occurrence, therefore an additional cost of 128 plus 128, equals 256 bits.

k. Therefore, the total cost associated to the first first and second first data structures is 79 plus 79 plus 256, equals 414 bits.

l. The second first data structure does not have any member 2, since this was swapped in the first first data structure, therefore, the second first data structure has a zero occurrence member, member 2.

m. The member 2 occurrences in the second data structure are therefore swapped into the second first data structure at their occurrence location, and whatever was at that location in the second first data structure is swapped back into the second data structure. In the second data structure therefore, member 2 representation can be used to replace the target member, which may be all class 19 members, to produce gain.

n. Given that for the second data structure, eight pairs are available, the maximum number of occurrences per 500 chain that can be captured within the second data structure is eight, when class 19 members are used as target. Considering the average to be four members captured per each 500 chain, for 256 chains there will be 1024 members captured. In order to get the most members captured, the eight pairs are fully chosen among the 512 pairs with another computational optimization procedure. Given the wide range of choices, considering only 1024 members to be captured is again a pessimistic scenario, but suggestive for what can be done as a worst case during the compression.

o. The cost to specify the eight pairs for the second data structure is therefore eight times nine, equals 72 bits.

p. Accordingly, the total cost, for all three data structures, is 414 plus 72 equals 486 bits. The gross compression gain is 1024 bits, i.e. one bit gain per occurrence. Therefore, the net gain, in a pessimistic scenario, is 1024 minus 486, equals 538 bits.

From reading the present disclosure, other variations and modifications will be apparent to the skilled person. Such variations and modifications may involve equivalent and other features which are already known in the art or are implied by the embodiments presented in this disclosure. Such variations and modifications may include variations in protocol, increase in performance such as improvements in the communication delay, variations that do not change the substance and object of this disclosure.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, and reference signs in the claims shall not be construed as limiting the scope of the claims.

The invention claimed is:

1. A method for lossless compression of a binary input data string (IFDS), comprising:

partitioning said IFDS in processing strings (PS) as they serially occur in said IFDS, with every said occurring PS belonging to a set of PS, comprising:

every PS in said set is unique and has a number of bits greater than a minimum number of bits;

there is one or more PS having the same number of bits, and all PS of same number of bits form a class of PS;

within a said class of PS, one or more PS are represented by a common header called root identifier (RI) with said RI having a number of bits that is smaller or equal to the number of bits of that class of PS, followed by a difference number of bits equal to the difference between the number of bits of that class of PS and the number of bits of said RI, where said difference number of bits is called remain; and all said RI of all said classes of PS form a set of RI, with every RI in said set of RI having a number of bits greater than a minimum number of bits and being unique, with one or more RI having the same number of bits, and with all RI of same number of bits forming a class of RI;

describing said IFDS using said RI in said set of RI by making the correspondence between every said occurring PS and the corresponding RI, called occurring RI;

dividing said IFDS as described by said occurring RI in a first number of serial groups of said occurring RI called pairing ranges, with each said pairing range having a same second number of said serially occurring RI, wherein:

each of said first number of said pairing ranges receives a first order number in ascending order starting with one;

within each said pairing range, each RI can be part of a higher order combination of RI such as pairs or triplets, with each RI belonging to only one such higher order combination, wherein:

a said higher order combination of RI is also unique and has a number of bits greater than a minimum number of bits; and one or more said higher order combinations have the same number of bits, with all said higher order combinations of same number of bits forming a class of said higher order combinations, and with all classes of higher order combinations forming a set of higher order combinations; and in all said pairing ranges, either individual RI or one of said higher order combinations is engaged and called RI derivative, with said RI derivative in each said pairing range receiving a second order number in ascending order starting with one;

creating a first data structure, comprising:

occurrence of said first RI derivative number of said pairing ranges;

if in a pairing range of a first order number said first RI derivative occurs multiple times, each time at a different said second order number, said first RI derivative that has a second order number value that is the closest to the second order number value of the current segment of said first data structure is considered; and said first RI derivative is selected when in all segments of said first data structure, no occurrence of said first RI derivative exists, and when at least one occurrence of said first RI derivative exists, a different first RI derivative is considered;

creating a second data structure, comprising:

a second RI derivative belonging to a said RI derivative class of a fourth number of bits greater or equal to said third number of bits of said first RI derivative;

a same first maximum number of said pairing ranges;

one or more segments, also known as legs, wherein:

each said segment comprising of said occurring RI derivatives that have the same second order number in pairing ranges of consecutive first order numbers;

a first said segment starts with a said occurring RI derivative having a said second order number and being located at said pairing range of first order number of value one, and ends with a said second RI derivative located at a pairing range of a first order number of value greater than one;

every subsequent segment starts with a said occurring RI derivative having said second order number equal to a second order number at which a next occurrence of said second RI derivative has the highest probability to occur, and a said pairing range of first order number value equal to the first order number of last occurrence of said second RI derivative plus one, and ends with a said second RI derivate located at a pairing range of a first order number of value greater or equal to the first order number of last occurrence of said second RI derivative plus one, or ends with a said occurring RI derivative located at a pairing range of said first order number of value equal to said first maximum when said second RI derivative does not occur before said first maximum is reached on current said segment;

said next occurrence of said second RI derivative has the highest probability to occur when located on a second order number on which said second RI derivative occurred last at the largest distance in term of the difference between said first order number of said second RI derivative that occurred last and current said first order number;

if there are multiple said second RI derivatives of same highest probability each at a different second order number, the second order number of a value that is the closest to the second order number value of the current segment of said second structure is considered; and said second RI derivative is selected when in all segments of said second data structure, the number of occurrences of said second RI derivative is maximum among all other second RI derivates that can be selected; and processing said first data structure and said second data structure together, in order to generate an output file featuring compression gain, with said compression gain being expressed in term of a fifth number of bits.

2. The method of claim 1 wherein if said pairing ranges in said first maximum number of pairing ranges are common to said first data structure and said second data structure, no RI derivative, or no portion of any said segment, is allowed to belong to both said first and second data structures.

3. The method of claim 1 wherein said second number of RI derivatives in a said pairing range are divided in two equal parts, a first part and a second part with an equal number of RI derivatives, with said first part being used for said segments of said first data structure and said second part being used for said segments of said second data structure.

4. The method of claim 3 wherein:

said number of RI derivatives in said first part and said number of RI derivatives in said second part are optimized and are not equal to each other, comprising:

a larger number of said RI derivatives in said first part enables a said first RI derivative to be selected; and a larger number of said RI derivatives in said second part increases the number of occurrences of said second RI derivative in all said segments of said second data structure, increasing said fifth number of bits expressing said compression gain.

5. The method of claim 1 wherein a header comprising said first RI derivative and said second RI derivative is written in said output file as a sixth number of bits, also known as cost, in order to uniquely reconstruct, or decompress said output file into the original said IFDS.

6. The method of claim 5 wherein said first maximum number of pairing ranges is chosen such that said fifth number of bits representing said compression gain is larger than said sixth number of bits representing said cost.

7. The method of claim 6 where said lossless compression is said uniquely decompressed, with the input of said uniquely decompression process being said output file, with the output of said uniquely decompression process being said IFDS, and with said uniquely decompression process comprising interpreting said header and reversing said processing.

8. The method of claim 1, further comprising:

selecting said first RI derivative when in all segments of said first data structure, the number of occurrence of said first RI derivative is minimum among all other first RI derivates that can be selected, with no said first RI derivatives that can be selected having no occurrences in all segments of said first data structure; and adding one more said first data structure to said processing in order to generate an output file featuring compression gain, therefore processing two said first data structures and one said second data structure together in order to generate a said output file featuring compression gain, with said two first data structures being called first-first data structure and second-first data structure, with said first RI derivative being selected in both said first-first and second-first data structures to have the sum of occurrences in both said first data structures at the minimum among all other first RI derivatives that can be selected.

9. The method of claim 8, wherein said processing in order to generate a said output file featuring compression gain comprising:

modifying a said first RI derivative occurring in said first-first data structure by attaching a one bit termination with said bit being 0 logic and calling it first-zero RI derivative, and modifying a said first RI derivative occurring in said second-first data structure by attaching a one bit termination with said bit being 1 logic and calling it first-one RI derivative;

moving a said first-one RI derivative occurring in said second-first data structure at a said pairing range of a said first order number in said first-first data structure at the same pairing range, and moving said RI derivative that was at that said pairing range in said first-first data structure in said second-first data structure where said first-one RI derivative was, resulting in said second-first data structure having no occurrences of said first RI derivative;

moving a said first RI derivative occurring in said second data structure at a said pairing range of a said first order number in said second-first data structure at the same pairing range, and moving said RI derivative that was at that said pairing range in said second-first data structure in said second data structure where said first RI derivative was, resulting in said second data structure having no occurrences of said first RI derivative;

using said first RI derivative in said second data structure after all said first RI derivatives occurring in said second data structure are moved in said second-first data structure, with said first RI derivative being used together with said second RI derivative to generate a compression gain greater or equal to one bit per every occurrence of said second RI derivative in said second data structure; and generating said compression gain of said fifth number of bits comprising said compression gain greater or equal to one bit per every occurrence of said second RI derivative multiplied with said number of occurrences of said second RI derivative in said second data structure minus the sum of occurrences of said first-zero RI derivative in said first-first data structure and said first-one RI derivative in said second-first data structure.

10. The method of claim 1, wherein said processing in order to generate a said output file featuring compression gain comprising:

moving a said first RI derivative occurring in said second data structure at a said pairing range of a said first order number in said first data structure at same pairing range, and moving said RI derivative that was at that said pairing range in said first data structure in said second data structure where said first RI derivative was, resulting in said second data structure to have no occurrences of said first RI derivative;

using said first RI derivative in said second data structure after all said first RI derivatives occurring in said second data structure have been moved in said first data structure, with said first RI derivative being used together with said second RI derivative to generate a compression gain greater or equal to one bit per every occurrence of said second RI derivative in said second data structure; and generating said compression gain of said fifth number of bits comprising said compression gain greater or equal to one bit per every occurrence of said second RI derivative multiplied with said number of occurrences of said second RI derivative in said second data structure.

11. The method of claim 1 wherein said first RI derivative is a higher order derivative comprising of two or more identical RI.

12. The method of claim 1, further comprising:

dividing said first number of pairing ranges of said IFDS into a seventh number of partitions called slices, with a said slice represented by a said first maximum number of said pairing ranges, with said seventh number being equal to the integer of said first number divided by said first maximum number, and with each said slice receiving a third order number starting with one and ending with said seventh number;

generating a total compressed IFDS by independently compressing each of said seventh number of slices and by assembling said output file of each said slice in the order of said third order number of each slice.

13. The method of claim 12, further comprising:

completing a compression cycle when a said total compressed IFDS is generated; and repeating a said compression cycle by having said total compressed IFDS to become a new IFDS for another said compression cycle, until a criteria is achieved, with said criteria comprising:

obtaining a target total compressed IFDS file size equal to an eighth number of bits that is larger or equal to a file floor size equal to a ninth number of bits, where a said total compressed IFDS of a size smaller than said file floor size cannot be optimally compressed.

14. A method for lossless compression of an arbitrary binary input data string (IFDS), comprising:

partitioning said IFDS in serially occurring Processing Strings (PS), with every PS belonging to a finite set of unique PS and having a number of bits;

describing said partitioned IFDS using a set of Root Identifiers (RI), with every RI representing one or more of said PS, being unique, and having a number of bits;

partitioning said RI describing said IFDS into a first number of serial groups of a second number of RI called pairing ranges, with each said pairing range receiving a first order number in ascending order starting with one and with each said RI occurring in each said pairing range receiving a second order number in ascending order starting with one;

creating a first data structure comprising a first maximum number of said paring ranges where one or more segments or legs are formed, with a said segment comprising said RI of same said second order number from consecutive said pairing ranges, where a new said segment is introduced in order to avoid the occurrence within said first data structure of a select said RI of a third number of bits called first RI such that said first data structure to have no occurrence of said first RI;

creating a second data structure comprising said first maximum number of said pairing ranges where one or more segments or legs are formed, with a said segment comprising said RI of same said second order number from consecutive said pairing ranges, where a new said segment is introduced in order to include within said second data structure the occurrence of a select said RI of a fourth number of bits greater or equal to said third number of bits called second RI such that said second data structure has a maximum number of occurrences of said second RI; and processing said first data structure and said second data structure together, in order to generate an output file featuring compression gain, with said compression gain being expressed in term of a fifth number of bits, with said processing comprising:

moving a said first RI occurring in said second data structure at a said pairing range of a said first order number in said first data structure at same said pairing range, and moving a said RI that occurs at that said pairing range in said first data structure in said second data structure where said first RI was, resulting in said second data structure having no occurrences of said first RI;

using said first RI in said second data structure after all said first RI occurring in said second data structure have been moved in said first data structure, with said first RI being used together with said second RI to generate a compression gain greater or equal to one bit per every occurrence of said second RI in said second data structure; and generating said compression gain of said fifth number of bits comprising said compression gain greater or equal to one bit per every occurrence of said second RI multiplied with said number of occurrences of said second RI in said second data structure.

15. A method for lossless compression of an arbitrary binary input data string (IFDS), comprising:

describing said IFDS using a finite set of Root Identifiers (RI) with each RI in said set being unique, having a number of bits, and representing one or more Processing Strings (PS), with said PS being used to fully partition said IFDS, being unique, having a number of bits, and being part of a finite set of PS;

partitioning said RI describing said IFDS into a first number of serial groups of a second number of RI called pairing ranges, with each said pairing range receiving a first order number in ascending order starting with one and with each said RI occurring in each said pairing range receiving a second order number in ascending order starting with one;

creating a first data structure comprising a first select sequence of said RI occurring across said pairing ranges, such that said RI in said first data structure does not include a first RI characterized by a third number of bits;

creating a second data structure comprising a second select sequence of said RI occurring across said pairing ranges where said RI in said second select sequence are different from said RI in said first select sequence, such that said RI in said second data structure include a maximum number of occurrences of a second RI characterized by a fourth number of bits that is greater or equal to said third number of bits; and processing said first and said second data structures together such that said first RI together with said second RI generate a number of bits of compression gain that is greater or equal to one bit per each occurrence of said second RI in said second data structure.

* * * * *